(12) United States Patent
Negley (10) Patent No.: US 8,328,376 B2
(45) Date of Patent: Dec. 11, 2012

(54) LIGHTING DEVICE

(75) Inventor: Gerald H. Negley, Durham, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 12/570,712

(22) Filed: Sep. 30, 2009

(65) Prior Publication Data

US 2010/0020532 A1 Jan. 28, 2010

Related U.S. Application Data

(63) Continuation of application No. 11/614,180, filed on Dec. 21, 2006, now Pat. No. 7,614,759.

(60) Provisional application No. 60/753,138, filed on Dec. 22, 2005, provisional application No. 60/831,775, filed on Jul. 19, 2006.

(51) Int. Cl.
*F21V 33/00* (2006.01)

(52) U.S. Cl. .......................................... 362/84

(58) Field of Classification Search ...................... 362/84
See application file for complete search history.

(56) References Cited

U.S. PATENT DOCUMENTS

| | | | |
|---|---|---|---|
| 3,805,937 A | 4/1974 | Hatanaka et al. |
| 3,875,456 A | 4/1975 | Kano et al. |
| 3,927,290 A | 12/1975 | Denley |
| 4,042,552 A | 8/1977 | Grucza |
| 4,081,764 A | 3/1978 | Christmann et al. |
| 4,107,238 A | 8/1978 | Roper et al. |
| 4,120,026 A | 10/1978 | Tsuchihashi et al. |
| 4,141,941 A | 2/1979 | Travnicek |
| 4,320,268 A | 3/1982 | Brown |
| 4,325,146 A | 4/1982 | Lennington |
| 4,337,506 A | 6/1982 | Terada |
| 4,346,275 A | 8/1982 | Iwakira |
| 4,388,678 A | 6/1983 | Turner |
| 4,408,157 A | 10/1983 | Beaubien |

(Continued)

FOREIGN PATENT DOCUMENTS

DE      39 16 875      12/1990

(Continued)

OTHER PUBLICATIONS

Kim et al., "Strongly Enhanced Phosphor Efficiency in GaInN White Light-Emitting Diodes Using Remote Phosphor Configuration and Diffuse Reflector Cup", Japanese Journal of Applied Physics, vol. 44, Now. 21, 2005, pp. L649-L651.

(Continued)

*Primary Examiner* — Laura Tso (74) *Attorney, Agent, or Firm* — Burr & Brown (57) ABSTRACT

A lighting device comprising at least one solid state light emitter and at least one luminescent element spaced from the light emitter, a surface of the luminescent element being at least twice as large as the illumination surface of the light emitter. Also, a lighting device comprising at least one solid state light emitter and at least one luminescent element spaced from the light emitter, a surface of the luminescent element surface being at least twice as large as and substantially parallel to the illumination surface of the light emitter. Also, a lighting device comprising at least one solid state light emitter and at least one luminescent element spaced from the light emitter, a surface area of a projection of the luminescent element being at least twice as large as a surface area of a projection of the light emitter.

21 Claims, 3 Drawing Sheets

U.S. PATENT DOCUMENTS

| | | | |
|---|---|---|---|
| 4,420,398 A | 12/1983 | Castino |
| 4,562,018 A | 12/1985 | Neefe |
| 4,710,699 A | 12/1987 | Miyamoto |
| 4,727,289 A | 2/1988 | Uchida |
| 4,826,424 A | 5/1989 | Arai et al. |
| 4,918,487 A | 4/1990 | Coulter, Jr. |
| 4,918,497 A | 4/1990 | Edmond |
| 4,933,822 A | 6/1990 | NakaMats |
| 4,966,862 A | 10/1990 | Edmond |
| 4,994,946 A | 2/1991 | NakaMats |
| 5,027,168 A | 6/1991 | Edmond |
| 5,087,883 A | 2/1992 | Hoffman |
| 5,087,949 A | 2/1992 | Haitz |
| 5,110,278 A | 5/1992 | Tait et al. |
| 5,134,550 A | 7/1992 | Young |
| 5,140,220 A | 8/1992 | Hasegawa |
| 5,143,660 A | 9/1992 | Hamilton et al. |
| 5,210,051 A | 5/1993 | Carter, Jr. |
| 5,264,997 A | 11/1993 | Hutchisson et al. |
| 5,277,840 A | 1/1994 | Osaka et al. |
| 5,338,944 A | 8/1994 | Edmond et al. |
| 5,374,668 A | 12/1994 | Kanemura et al. |
| 5,393,993 A | 2/1995 | Edmond et al. |
| 5,407,799 A | 4/1995 | Studier |
| 5,410,519 A | 4/1995 | Hall et al. |
| 5,416,342 A | 5/1995 | Edmond et al. |
| 5,477,430 A | 12/1995 | LaRose |
| 5,477,436 A | 12/1995 | Bertling et al. |
| 5,523,589 A | 6/1996 | Edmond et al. |
| 5,535,230 A | 7/1996 | Abe |
| 5,561,346 A | 10/1996 | Byrne |
| 5,563,849 A | 10/1996 | Hall et al. |
| 5,575,550 A | 11/1996 | Appeldorn et al. |
| 5,581,683 A | 12/1996 | Bertignoll et al. |
| 5,585,640 A | 12/1996 | Huston et al. |
| 5,604,135 A | 2/1997 | Edmond et al. |
| 5,614,734 A | 3/1997 | Guido |
| 5,631,190 A | 5/1997 | Negley |
| 5,669,486 A | 9/1997 | Shima |
| 5,688,042 A | 11/1997 | Madadi et al. |
| 5,739,554 A | 4/1998 | Edmond et al. |
| 5,753,730 A | 5/1998 | Nagata et al. |
| 5,803,579 A | 9/1998 | Turnbull et al. |
| 5,813,753 A | 9/1998 | Vriens et al. |
| 5,850,126 A | 12/1998 | Kanbar |
| 5,851,063 A | 12/1998 | Doughty et al. |
| 5,858,278 A | 1/1999 | Itoh et al. |
| 5,882,553 A | 3/1999 | Prophet et al. |
| 5,906,425 A | 5/1999 | Gordin et al. |
| 5,912,477 A | 6/1999 | Negley |
| 5,931,570 A | 8/1999 | Yamuro |
| 5,956,106 A | 9/1999 | Petersen et al. |
| 5,959,316 A | 9/1999 | Lowery |
| 5,962,971 A | 10/1999 | Chen |
| 5,968,422 A | 10/1999 | Kennedy |
| 6,066,861 A | 5/2000 | Höhn et al. |
| 6,069,440 A | 5/2000 | Shimizu et al. |
| 6,076,936 A | 6/2000 | George |
| 6,084,250 A | 7/2000 | Justel et al. |
| 6,095,666 A | 8/2000 | Salam |
| 6,120,600 A | 9/2000 | Edmond et al. |
| 6,132,072 A | 10/2000 | Turnbull et al. |
| 6,156,242 A | 12/2000 | Saito et al. |
| 6,177,688 B1 | 1/2001 | Linthicum et al. |
| 6,187,606 B1 | 2/2001 | Edmond et al. |
| 6,201,262 B1 | 3/2001 | Edmond et al. |
| 6,212,213 B1 | 4/2001 | Weber et al. |
| 6,234,648 B1 | 5/2001 | Borner et al. |
| 6,245,259 B1 | 6/2001 | Höhn et al. |
| 6,252,254 B1 | 6/2001 | Soules et al. |
| 6,255,670 B1 | 7/2001 | Srivastava et al. |
| 6,278,135 B1 | 8/2001 | Srivastava et al. |
| 6,292,901 B1 | 9/2001 | Lys et al. |
| 6,294,800 B1 | 9/2001 | Duggal et al. |
| 6,319,425 B1 | 11/2001 | Tasaki et al. |
| 6,329,676 B1 | 12/2001 | Takayama et al. |
| 6,335,538 B1 | 1/2002 | Prutchi et al. |
| 6,337,536 B1 | 1/2002 | Matsubara et al. |
| 6,340,824 B1 | 1/2002 | Komoto et al. |
| 6,346,973 B1 | 2/2002 | Shibamoto et al. |
| 6,348,766 B1 | 2/2002 | Ohishi et al. |
| 6,350,041 B1 | 2/2002 | Tarsa et al. |
| 6,357,889 B1 | 3/2002 | Duggal et al. |
| 6,373,188 B1 | 4/2002 | Johnson et al. |
| 6,383,417 B1 | 5/2002 | Paulson et al. |
| 6,391,231 B1 | 5/2002 | Evans et al. |
| 6,394,621 B1 | 5/2002 | Hanewinkel |
| 6,404,125 B1 | 6/2002 | Garbuzov et al. |
| 6,429,583 B1 | 8/2002 | Levinson et al. |
| 6,441,558 B1 | 8/2002 | Muthu et al. |
| 6,480,299 B1 | 11/2002 | Drakopoulos et al. |
| 6,490,104 B1 | 12/2002 | Gleckman et al. |
| 6,501,100 B1 | 12/2002 | Srivastava et al. |
| 6,504,179 B1 | 1/2003 | Ellens et al. |
| 6,504,301 B1 | 1/2003 | Lowery |
| 6,513,949 B1 | 2/2003 | Marshall et al. |
| 6,521,915 B2 | 2/2003 | Odaki et al. |
| 6,522,065 B1 | 2/2003 | Srivastava et al. |
| 6,538,371 B1 | 3/2003 | Duggal et al. |
| 6,547,249 B2 | 4/2003 | Collins, III |
| 6,550,949 B1 | 4/2003 | Bauer et al. |
| 6,552,495 B1 | 4/2003 | Chang |
| 6,573,537 B1 | 6/2003 | Steigerwald et al. |
| 6,573,653 B1 | 6/2003 | Ishinaga |
| 6,576,488 B2 | 6/2003 | Collins, III et al. |
| 6,576,930 B2 | 6/2003 | Reeh et al. |
| 6,577,073 B2 | 6/2003 | Shimizu et al. |
| 6,578,986 B2 | 6/2003 | Swaris et al. |
| 6,592,810 B2 | 7/2003 | Nishida et al. |
| 6,600,175 B1 | 7/2003 | Baretz et al. |
| 6,600,324 B2 | 7/2003 | St-Germain |
| 6,601,984 B2 | 8/2003 | Yamamoto et al. |
| 6,603,258 B1 | 8/2003 | Mueller-Mach et al. |
| 6,608,485 B2 | 8/2003 | St-Germain |
| 6,616,862 B2 | 9/2003 | Srivastava |
| 6,624,350 B2 | 9/2003 | Nixon et al. |
| 6,635,503 B2 | 10/2003 | Andrews et al. |
| 6,636,003 B2 | 10/2003 | Rahm et al. |
| 6,642,618 B2 | 11/2003 | Yagi et al. |
| 6,642,652 B2 | 11/2003 | Collins, III et al. |
| 6,642,666 B1 | 11/2003 | St-Germain |
| 6,685,852 B2 | 2/2004 | Setlur et al. |
| 6,686,691 B1 | 2/2004 | Mueller et al. |
| 6,692,136 B2 | 2/2004 | Marshall et al. |
| 6,703,173 B2 | 3/2004 | Lu et al. |
| 6,712,486 B1 | 3/2004 | Popovich et al. |
| 6,730,939 B2 | 5/2004 | Eisert et al. |
| 6,734,465 B1 | 5/2004 | Taskar et al. |
| 6,737,801 B2 | 5/2004 | Ragle |
| 6,744,077 B2 | 6/2004 | Trottier |
| 6,744,194 B2 | 6/2004 | Fukasawa et al. |
| 6,762,563 B2 | 7/2004 | St-Germain |
| 6,784,463 B2 | 8/2004 | Camras et al. |
| 6,791,119 B2 | 9/2004 | Slater et al. |
| 6,791,257 B1 | 9/2004 | Sato et al. |
| 6,800,500 B2 | 10/2004 | Coman et al. |
| 6,809,347 B2 | 10/2004 | Tasch et al. |
| 6,817,735 B2 | 11/2004 | Shimizu et al. |
| 6,821,804 B2 | 11/2004 | Thibeault et al. |
| 6,841,804 B1 | 1/2005 | Chen et al. |
| 6,851,834 B2 | 2/2005 | Leysath |
| 6,853,131 B2 | 2/2005 | Srivastava et al. |
| 6,880,954 B2 | 4/2005 | Ollett et al. |
| 6,882,101 B2 | 4/2005 | Ragle |
| 6,885,035 B2 | 4/2005 | Bhat et al. |
| 6,890,085 B2 | 5/2005 | Hacker |
| 6,914,267 B2 | 7/2005 | Fukasawa et al. |
| 6,936,857 B2 | 8/2005 | Doxsee et al. |
| 6,939,481 B2 | 9/2005 | Srivastava et al. |
| 6,957,899 B2 | 10/2005 | Jiang et al. |
| 6,960,878 B2 | 11/2005 | Sakano et al. |
| 6,963,166 B2 | 11/2005 | Yano et al. |
| 6,967,116 B2 | 11/2005 | Negley |
| 6,972,438 B2 | 12/2005 | Li et al. |
| 7,005,679 B2 | 2/2006 | Tarsa et al. |
| 7,008,078 B2 | 3/2006 | Shimizu et al. |
| 7,009,199 B2 | 3/2006 | Hall |

| | | | | | | |
|---|---|---|---|---|---|---|
| 7,009,343 B2 | 3/2006 | Lim et al. | | 2003/0209714 A1 | 11/2003 | Taskar et al. |
| 7,014,336 B1 | 3/2006 | Ducharme et al. | | 2003/0209997 A1 | 11/2003 | St-Germain et al. |
| 7,015,511 B2 | 3/2006 | Sakai et al. | | 2003/0214817 A1 | 11/2003 | Hacker |
| 7,023,019 B2 | 4/2006 | Maeda et al. | | 2003/0222268 A1 | 12/2003 | Yocom et al. |
| 7,029,935 B2 | 4/2006 | Negley et al. | | 2004/0012027 A1 | 1/2004 | Keller et al. |
| 7,040,774 B2 | 5/2006 | Beeson et al. | | 2004/0041222 A1 | 3/2004 | Loh |
| 7,061,454 B2 | 6/2006 | Sasuga et al. | | 2004/0046178 A1 | 3/2004 | Sano |
| 7,066,623 B2 | 6/2006 | Lee et al. | | 2004/0056260 A1 | 3/2004 | Slater, Jr. et al. |
| 7,083,302 B2 | 8/2006 | Chen et al. | | 2004/0095763 A1 | 5/2004 | Guerrieri et al. |
| 7,093,958 B2 | 8/2006 | Coushaine | | 2004/0104391 A1 | 6/2004 | Maeda et al. |
| 7,095,056 B2 | 8/2006 | Vitta | | 2004/0105261 A1 | 6/2004 | Ducharme et al. |
| 7,102,172 B2 | 9/2006 | Lynch et al. | | 2004/0105264 A1 | 6/2004 | Spero |
| 7,135,664 B2 | 11/2006 | Vornsand et al. | | 2004/0150997 A1 | 8/2004 | Ouderkirk et al. |
| 7,144,131 B2 | 12/2006 | Rains | | 2004/0184270 A1 | 9/2004 | Halter |
| 7,153,015 B2 | 12/2006 | Brukilacchio | | 2004/0213229 A1 | 10/2004 | Mahacsi |
| 7,164,231 B2 | 1/2007 | Choi et al. | | 2004/0217364 A1* | 11/2004 | Tarsa et al. ...................... 257/89 |
| 7,207,691 B2 | 4/2007 | Lee et al. | | 2004/0218387 A1 | 11/2004 | Gerlach |
| 7,213,940 B1 | 5/2007 | Van De Ven et al. | | 2004/0218390 A1 | 11/2004 | Holman et al. |
| 7,213,942 B2 | 5/2007 | Jiang et al. | | 2004/0218391 A1 | 11/2004 | Procter |
| 7,215,074 B2 | 5/2007 | Shimizu et al. | | 2004/0222735 A1 | 11/2004 | Ragle |
| 7,221,044 B2 | 5/2007 | Fan et al. | | 2004/0223223 A1 | 11/2004 | Lee |
| 7,232,212 B2 | 6/2007 | Iwase | | 2004/0252502 A1 | 12/2004 | McCullough et al. |
| 7,239,085 B2 | 7/2007 | Kawamura | | 2004/0252962 A1 | 12/2004 | Ryan, Jr. |
| 7,250,715 B2 | 7/2007 | Mueller et al. | | 2004/0264193 A1 | 12/2004 | Okumura |
| 7,255,457 B2 | 8/2007 | Ducharme et al. | | 2005/0002191 A1 | 1/2005 | Shimizu et al. |
| 7,256,557 B2 | 8/2007 | Lim et al. | | 2005/0030744 A1 | 2/2005 | Ducharme et al. |
| 7,261,441 B2 | 8/2007 | Ng et al. | | 2005/0052378 A1 | 3/2005 | Hacker |
| 7,264,378 B2 | 9/2007 | Loh et al. | | 2005/0057917 A1* | 3/2005 | Yatsuda et al. .................. 362/84 |
| 7,293,908 B2 | 11/2007 | Beeson et al. | | 2005/0082562 A1 | 4/2005 | Ou et al. |
| 7,329,024 B2 | 2/2008 | Lynch et al. | | 2005/0082974 A1 | 4/2005 | Fukasawa et al. |
| 7,332,746 B1 | 2/2008 | Takahashi et al. | | 2005/0093008 A1 | 5/2005 | Suehiro et al. |
| 7,334,917 B2 | 2/2008 | Laski | | 2005/0093430 A1* | 5/2005 | Ibbetson et al. .............. 313/501 |
| 7,358,954 B2 | 4/2008 | Negley | | 2005/0094401 A1 | 5/2005 | Magarill |
| 7,360,937 B2 | 4/2008 | Han et al. | | 2005/0105301 A1 | 5/2005 | Takeda et al. |
| 7,422,504 B2 | 9/2008 | Maeda et al. | | 2005/0111236 A1* | 5/2005 | Hulse ............................ 362/555 |
| 7,453,195 B2 | 11/2008 | Radkov | | 2005/0117334 A1 | 6/2005 | Lee et al. |
| 7,462,502 B2 | 12/2008 | Paolini et al. | | 2005/0127381 A1 | 6/2005 | Vitta et al. |
| 7,474,044 B2 | 1/2009 | Ge | | 2005/0128744 A1 | 6/2005 | You et al. |
| 7,479,662 B2 | 1/2009 | Soules et al. | | 2005/0184638 A1 | 8/2005 | Mueller et al. |
| 7,791,092 B2 | 9/2010 | Tarsa et al. | | 2005/0190559 A1 | 9/2005 | Kragl |
| 7,869,483 B2 | 1/2011 | Uchida et al. | | 2005/0227569 A1 | 10/2005 | Maeda et al. |
| 8,067,254 B2 | 11/2011 | Camras et al. | | 2005/0231948 A1 | 10/2005 | Pohlert et al. |
| 2001/0000622 A1 | 5/2001 | Reeh et al. | | 2005/0236628 A1 | 10/2005 | Matsuura |
| 2001/0002049 A1 | 5/2001 | Reeh et al. | | 2005/0243556 A1 | 11/2005 | Lynch |
| 2001/0009510 A1 | 7/2001 | Lodhie | | 2005/0248958 A1 | 11/2005 | Li |
| 2002/0015013 A1 | 2/2002 | Ragle | | 2005/0251698 A1 | 11/2005 | Lynch et al. |
| 2002/0039002 A1 | 4/2002 | Fukasawa et al. | | 2005/0253151 A1 | 11/2005 | Sakai et al. |
| 2002/0070681 A1 | 6/2002 | Shimizu et al. | | 2005/0259423 A1 | 11/2005 | Heuser et al. |
| 2002/0087532 A1 | 7/2002 | Barritz et al. | | 2005/0274972 A1 | 12/2005 | Roth et al. |
| 2002/0093820 A1 | 7/2002 | Pederson | | 2006/0006402 A1 | 1/2006 | Hsieh et al. |
| 2002/0123164 A1 | 9/2002 | Slater, Jr. et al. | | 2006/0012989 A1 | 1/2006 | Lee |
| 2002/0149314 A1 | 10/2002 | Takahashi et al. | | 2006/0022582 A1 | 2/2006 | Radkov |
| 2002/0153835 A1 | 10/2002 | Fujiwara | | 2006/0034084 A1 | 2/2006 | Matsuura et al. |
| 2002/0163302 A1 | 11/2002 | Nitta | | 2006/0040416 A1 | 2/2006 | Sano |
| 2002/0171911 A1 | 11/2002 | Maegawa | | 2006/0056169 A1 | 3/2006 | Lodhie et al. |
| 2002/0172354 A1 | 11/2002 | Nishi | | 2006/0060872 A1 | 3/2006 | Edmond et al. |
| 2002/0190637 A1 | 12/2002 | Matsubara et al. | | 2006/0060888 A1 | 3/2006 | Kim et al. |
| 2002/0196638 A1 | 12/2002 | Stephens et al. | | 2006/0061988 A1 | 3/2006 | Johnson et al. |
| 2003/0001166 A1 | 1/2003 | Waalib-Singh et al. | | 2006/0067073 A1 | 3/2006 | Ting |
| 2003/0006418 A1 | 1/2003 | Emerson et al. | | 2006/0071589 A1 | 4/2006 | Radkov |
| 2003/0026096 A1 | 2/2003 | Ellens et al. | | 2006/0092643 A1 | 5/2006 | Wong et al. |
| 2003/0030063 A1 | 2/2003 | Sosniak et al. | | 2006/0104060 A1 | 5/2006 | Kragl |
| 2003/0038295 A1 | 2/2003 | Koda | | 2006/0105482 A1 | 5/2006 | Alferink et al. |
| 2003/0042908 A1 | 3/2003 | St-Germain | | 2006/0113548 A1 | 6/2006 | Chen et al. |
| 2003/0042914 A1 | 3/2003 | St-Germain | | 2006/0120073 A1 | 6/2006 | Pickard et al. |
| 2003/0067302 A1 | 4/2003 | St-Germain | | 2006/0138435 A1 | 6/2006 | Tarsa et al. |
| 2003/0067758 A1 | 4/2003 | Shipman | | 2006/0138937 A1 | 6/2006 | Ibbetson |
| 2003/0067773 A1 | 4/2003 | Marshall et al. | | 2006/0145172 A1 | 7/2006 | Su et al. |
| 2003/0089918 A1 | 5/2003 | Hiller et al. | | 2006/0154392 A1 | 7/2006 | Tran et al. |
| 2003/0111667 A1 | 6/2003 | Schubert | | 2006/0180818 A1 | 8/2006 | Nagai et al. |
| 2003/0113108 A1 | 6/2003 | Bittner | | 2006/0181192 A1 | 8/2006 | Radkov et al. |
| 2003/0124752 A1 | 7/2003 | Wei et al. | | 2006/0181879 A1 | 8/2006 | Pederson |
| 2003/0128341 A1 | 7/2003 | Li | | 2006/0209558 A1 | 9/2006 | Chinniah et al. |
| 2003/0141506 A1 | 7/2003 | Sano et al. | | 2006/0245184 A1 | 11/2006 | Galli |
| 2003/0146411 A1 | 8/2003 | Srivastava et al. | | 2006/0255341 A1 | 11/2006 | Pinnington et al. |
| 2003/0151361 A1 | 8/2003 | Ishizaka | | 2007/0001188 A1 | 1/2007 | Lee |
| 2003/0153861 A1 | 8/2003 | Royer | | 2007/0024191 A1 | 2/2007 | Chen et al. |
| 2003/0165061 A1 | 9/2003 | Martineau | | 2007/0041220 A1 | 2/2007 | Lynch |
| 2003/0173575 A1 | 9/2003 | Eisert et al. | | 2007/0051966 A1 | 3/2007 | Higashi et al. |

| | | | | | | |
|---|---|---|---|---|---|---|
| 2007/0090381 A1 | 4/2007 | Otsuka et al. | EP | 1 081 771 | | 7/2001 |
| 2007/0137074 A1 | 6/2007 | Van de Ven et al. | EP | 1 160 883 | | 12/2001 |
| 2007/0139920 A1 | 6/2007 | Van de Ven et al. | EP | 1 193 772 | | 4/2002 |
| 2007/0139923 A1 | 6/2007 | Negley et al. | EP | 1 198 016 | | 4/2002 |
| 2007/0170447 A1 | 7/2007 | Negley et al. | EP | 1 253 373 | | 10/2002 |
| 2007/0171145 A1 | 7/2007 | Coleman et al. | EP | 1 367 655 | | 12/2003 |
| 2007/0202623 A1 | 8/2007 | Gao et al. | EP | 1 462 711 | | 9/2004 |
| 2007/0215890 A1 | 9/2007 | Harbers et al. | EP | 1 526 057 | | 4/2005 |
| 2007/0223219 A1 | 9/2007 | Medendorp et al. | EP | 1 566 848 | | 8/2005 |
| 2007/0236911 A1 | 10/2007 | Negley | EP | 1 571 715 | | 9/2005 |
| 2007/0247414 A1 | 10/2007 | Roberts | EP | 1 760 795 | | 3/2007 |
| 2007/0247847 A1 | 10/2007 | Villard | GB | 1 423 011 | | 1/1976 |
| 2007/0262337 A1 | 11/2007 | Villard | GB | 2 282 700 | | 4/1995 |
| 2007/0263393 A1 | 11/2007 | Van de Ven et al. | JP | 50-8494 | | 1/1975 |
| 2007/0267983 A1 | 11/2007 | Van de Ven et al. | JP | 05-152609 | | 6/1993 |
| 2007/0274063 A1 | 11/2007 | Negley | JP | 06-151974 | | 5/1994 |
| 2007/0274080 A1 | 11/2007 | Negley et al. | JP | 06-177429 | | 6/1994 |
| 2007/0276606 A1 | 11/2007 | Radkov et al. | JP | 06-244458 | | 9/1994 |
| 2007/0278503 A1 | 12/2007 | Van de Ven et al. | JP | 07-176794 | | 7/1995 |
| 2007/0278934 A1 | 12/2007 | Van de Ven et al. | JP | 07176794 | | 7/1995 |
| 2007/0278974 A1 | 12/2007 | Van de Ven | JP | 08-007614 | | 1/1996 |
| 2007/0279440 A1 | 12/2007 | Van de Ven et al. | JP | 08007614 | | 1/1996 |
| 2007/0279903 A1 | 12/2007 | Negley | JP | 08-162676 | | 6/1996 |
| 2007/0280624 A1 | 12/2007 | Negley et al. | JP | 09-153646 | | 6/1997 |
| 2007/0297179 A1 | 12/2007 | Leung et al. | JP | 09-246603 | | 9/1997 |
| 2008/0030993 A1 | 2/2008 | Narendran et al. | JP | 10-163535 | | 6/1998 |
| 2008/0048200 A1 | 2/2008 | Mueller et al. | JP | 10-242513 | | 9/1998 |
| 2008/0054281 A1 | 3/2008 | Narendran et al. | JP | 11-261114 | | 9/1999 |
| 2008/0084685 A1 | 4/2008 | Van de Ven et al. | JP | 11-298047 | | 10/1999 |
| 2008/0084700 A1 | 4/2008 | Negley | JP | 2000-022222 | | 1/2000 |
| 2008/0084701 A1 | 4/2008 | Van de Ven et al. | JP | 2000-101147 | | 4/2000 |
| 2008/0088248 A1 | 4/2008 | Myers | JP | 2000-174347 | | 6/2000 |
| 2008/0089053 A1 | 4/2008 | Negley | JP | 2000-183405 | | 6/2000 |
| 2008/0094829 A1 | 4/2008 | Narendran et al. | JP | 2000-183408 | | 6/2000 |
| 2008/0105887 A1 | 5/2008 | Narendran et al. | JP | 2000-286455 | | 10/2000 |
| 2008/0106895 A1 | 5/2008 | Van de Ven | JP | 2000-286458 | | 10/2000 |
| 2008/0106907 A1 | 5/2008 | Trott et al. | JP | 2000-353826 | | 12/2000 |
| 2008/0112168 A1 | 5/2008 | Pickard et al. | JP | 2001-077427 | | 3/2001 |
| 2008/0112170 A1 | 5/2008 | Trott et al. | JP | 2001-077433 | | 3/2001 |
| 2008/0112183 A1 | 5/2008 | Negley | JP | 2001-1111114 | | 4/2001 |
| 2008/0117500 A1 | 5/2008 | Narendran et al. | JP | 2001-144334 | | 5/2001 |
| 2008/0130265 A1 | 6/2008 | Negley | JP | 2001-1156331 | | 6/2001 |
| 2008/0130285 A1 | 6/2008 | Negley | JP | 2001-230453 | | 8/2001 |
| 2008/0136313 A1 | 6/2008 | Negley | JP | 2001-307506 | | 11/2001 |
| 2008/0137347 A1 | 6/2008 | Trott et al. | JP | 2002-118293 | | 4/2002 |
| 2008/0170396 A1 | 7/2008 | Yuan et al. | JP | 2002-133938 | | 5/2002 |
| 2008/0179602 A1 | 7/2008 | Negley | JP | 2002-150821 | | 5/2002 |
| 2008/0192462 A1 | 8/2008 | Steedly et al. | JP | 2002-158378 | | 5/2002 |
| 2008/0192493 A1 | 8/2008 | Villard | JP | 2002-223004 | | 8/2002 |
| 2008/0211416 A1 | 9/2008 | Negley et al. | JP | 2002-280616 | | 9/2002 |
| 2008/0231201 A1 | 9/2008 | Higley et al. | JP | 2002-299699 | | 10/2002 |
| 2008/0259589 A1 | 10/2008 | Van de Ven et al. | JP | 2003-017755 | | 1/2003 |
| 2008/0278928 A1 | 11/2008 | Van de Ven et al. | JP | 2003-515956 | | 5/2003 |
| 2008/0278940 A1 | 11/2008 | Van de Ven et al. | JP | 2003-529889 | | 10/2003 |
| 2008/0278950 A1 | 11/2008 | Pickard et al. | JP | 2003-347601 | | 12/2003 |
| 2008/0278952 A1 | 11/2008 | Trott et al. | JP | 2004-031856 | | 1/2004 |
| 2008/0284329 A1 | 11/2008 | Bertram et al. | JP | 2004-071357 | | 3/2004 |
| 2008/0304260 A1 | 12/2008 | Van de Ven et al. | JP | 2004-080046 | | 3/2004 |
| 2008/0304261 A1 | 12/2008 | Van de Ven et al. | JP | 2004-103443 | | 4/2004 |
| 2008/0304269 A1 | 12/2008 | Pickard et al. | JP | 2004-253309 | | 9/2004 |
| 2008/0309255 A1 | 12/2008 | Myers | JP | 2004-356116 | | 12/2004 |
| 2008/0310154 A1 | 12/2008 | Van de Ven et al. | JP | 2004-363055 | | 12/2004 |
| 2008/0315228 A1 | 12/2008 | Krames et al. | JP | 2005-005482 | | 1/2005 |
| 2009/0002986 A1 | 1/2009 | Medendorp | JP | 2005-101296 | | 4/2005 |
| 2009/0173958 A1 | 7/2009 | Chakraborty et al. | JP | 2005-142311 | | 6/2005 |
| 2010/0290221 A1 | 11/2010 | Tarsa et al. | JP | 2005-191514 | | 7/2005 |
| 2011/0018013 A1 | 1/2011 | Margalith et al. | JP | 2005-332963 | | 12/2005 |
| 2011/0132521 A1 | 6/2011 | Paolini et al. | JP | 2006-049799 | | 2/2006 |
| | | | JP | 2007-122950 | | 5/2007 |
| FOREIGN PATENT DOCUMENTS | | | JP | 2007-141737 | | 6/2007 |
| DE | 42 28 895 | 3/1994 | TW | 546854 | | 8/2003 |
| DE | 43 11 937 | 10/1994 | WO | 97/24706 | | 7/1997 |
| DE | 103 35 077 | 3/2005 | WO | 98/43014 | | 10/1998 |
| EP | 0 838 866 | 4/1998 | WO | 00/19546 | | 4/2000 |
| EP | 0 936 682 | 8/1999 | WO | 00/34709 | | 6/2000 |
| EP | 0 971 421 | 1/2000 | WO | 01/41225 | | 6/2001 |
| EP | 1 024 399 | 8/2000 | WO | 01/61764 | | 8/2001 |
| EP | 1 059 667 | 12/2000 | WO | 01/69692 | | 9/2001 |
| EP | 1 059 678 A2 | 12/2000 | WO | 02/059982 | | 8/2002 |

| WO | 03/065464 | 8/2003 |
| WO | 2004/068909 | 8/2004 |
| WO | 2004/100279 | 11/2004 |
| WO | 2004/100611 | 11/2004 |
| WO | 2005/004202 | 1/2005 |
| WO | 2005/013365 | 2/2005 |
| WO | 2005/055328 | 6/2005 |
| WO | 2005/078338 | 8/2005 |
| WO | 2005/124877 | 12/2005 |
| WO | 2006/028312 | 3/2006 |
| WO | 2006/039017 | 4/2006 |
| WO | 2006/061728 | 6/2006 |
| WO | 2006/099741 | 9/2006 |
| WO | 2007/002234 | 1/2007 |
| WO | 2007/061758 | 5/2007 |
| WO | 2007/063460 | 6/2007 |

OTHER PUBLICATIONS

U.S. Appl. No. 12/465,203, filed May 13, 2009, Pickard.
LEDsMagazine, Remote phosphor technique improves white LED output, Apr. 14, 2005, http://www.ledsmagazine.com/news/2/4/22, pp. 1.
High Efficiency, Nitride-Based, Solid-State Lighting, Summary of UCSB Research, Summary of LRC Research, www.lrc.rpi.edu/programs/solidstate/cr_nitridebasedssl.asp, pp. 1-2 (date not known).
Narendran et al., Extracting phosphor-scattered photons to improve white LED efficiency, Wiley InterScience :: Journals :: physica status solidi (a), Rapid Research Letter, Mar. 17, 2005, http://www3.interscience.wiley.com/journal/110437401/abstract, Abstract.
Narendran, *Improved Performance White LED*, Nov. 2005, Society of Photo-Optical Instrumentation Engineers, Fifth International Conference on Solid State Lighting, Proceedings of SPIE 5941, pp. 1-7.
Narendran, *Improving the performance of mixed-color white LED systems by using scattered photon extraction technique*, 2007 Copyright SPIE, The International Society for Optical Engineering, Seventh International Conference on Solid State Lighting, Proceedings of SPIE, Aug. 27, 2007, pp. 1-2, Sep. 17, 2007.
LRC Solid-State Lighting Papers and Publications, pp. 1-4, Feb. 2, 2006.
White Light LED, Part Nos. NSPW300BS and NSPW312BS, High Brightness LEDs, Nov. 12, 1999, Publisher: Nichia Corporation.
Craford, "Overview of Device Issues in High-Brightness Light-Emitting Diodes," Chapter, *High Brightness Light Emitting Diodes: Semiconductors and Semimetals*, vol. 48, Stringfellow et al. ed., Academic Press, 1997, pp. 47-63.
Nichia, White LED, Part Nos. NSPW300BS, "Specifications for Nichia White LED, Model NSPW300BS," Nichia Corporation, Jan. 12, 2004.
Niciha, White LED, Part Nos. NSPW312BS, "Specifications for Nichia White LED, Model NSPW312BS," Nichia Corporation, Jan. 14, 2004.
"An Even Brighter Idea," Economist.com, http://www.economist.com/science/tq/PrinterFriendly.cfm ?story_id=7904236; Sep. 22, 2006 (Science Technology Quarterly) pp. 1-6.
Van de Ven et al., "Warm White Illumination with High CRI and High Efficacy by Combining 455 nm Excited Yellowish Phosphor LEDs and Red AlInGaP LEDs", First International Conference on White LEDs and Solid State Lighting.
Cree® XLamp® 7090 XR-E Series LED Binning and Labeling.
Chhajed, S., *Influence of junction temperature on chromaticity and color-rendering properties of trichromatic white-light sources . . .* , Journal of Applied Physics, 2005, vol. 97, pp. 1-8.
Color Kinetics Inc., *Color Quality of Intelligent Solid-State Light Systems*, Color Quality of Solid-State Light Sources, Mar. 2005, pp. 1-3.
Narendran et al., *Color Rendering Properties of LED Light Sources*, Lighting Reserach Center, Renssalaer Polytechnic Institute, pp. 1-8, 2002.
Color Kinetics Support : White Papers & Presentations; *Solid State Lighting White Papers & Presentations*; http://www.colorkinetics.com/support/whitepapers/; pp. 1-4, Feb. 22, 2006.
Shimizu, Yoshinori, "Development of High-Efficiency LED Downlight", Proceeding to the First International Conference on White LEDs and Solid State Lighting, Nov. 26, 2007, pp. 1-5.
Press Release from LED Lighting Fixtures dated Apr. 24, 2006 entitled "LED Lighting Fixtures, Inc. achieves unprecedented gain in light output from new luminaire".
Press Release from LED Lighting Fixtures dated Feb. 16, 2006 entitled "LED Lighting Fixtures, Inc. Announces Record Performance".
Press Release from LED Lighting Fixtures dated Feb. 7, 2007 entitled "LED Lighting Fixtures Announces its first LED-based Recessed Down Light".
Press Release from LED Lighting Fixtures dated May 30, 2006 entitled "LED Lighting Fixtures, Inc. Sets World Record at 80 Lumens per Watt for Warm White Fixture".
Narendran et al., "Solid State lighting: failure analysis of white LEDs," (Abstract Only), Jun. 11, 2004, pp. 1-2.
Nichia, White Light LED, Part Nos. NSPW300BS and NSPW312BS, High Brightness LEDs, Nov. 12, 1999, Publisher: Nichia Corporation.
Permlight Inc., *Enbryten LED Product Information*, Feb. 2005, Publisher: Permlight Inc. website; accessed at http://www.webarchive.org displaying that www.permlight.com/products/LEDfixtures.asp was publicly available Jan. 2004.
Optoled Lighting Inc., *OptoLED Product Information*, 2009, Publisher: OptoLED GmBH website: accessed at http://222.optoled.de/englisch/products/led.html.
Krames et al., *Lumileds Lighting, Light from Silicon Valley*, Progress and Future Direction of LED Technology, SSL Workshop, Nov. 13, 2003, Publisher: Limileds Lighting Inc., pp. 1-21.
Compound Semiconductors Online, "LED Lighting Fixtures, Inc. Sets World Record at 80 Lumens per Watt for Warm White", Compound Semiconductors Online, May 30, 2006, pp. 1.
CSA International, "Test Data Report," Project Number: 1786317, Report Number: 1786317-1 (Apr. 20, 2006).
DOE SSL CALiPer Report, "Product Test Reference: CALiPER 07-31 Downlight Lamp".
Press Release from LED Lighting Fixtures dated Jan. 26, 2006 entitled "LED Lighting Fixtures Creates 750 Lumen Recessed Light and Uses Only 16 Watts of Power".
DOE SSL CALiPer Report, "Product Test Reference: CALiPER 07-47 Downlight Lamp".
U.S. Department of Energy, "DOE Solid-State Lighting CALiPER Program, Summary of Results: Round 3 of Product Testing," Oct. 2007.
U.S. Department of Energy, "DOE Solid-State Lighting CALiPER Program, Summary of Results: Round 4 of Product Testing," Jan. 2008.
U.S. Department of Energy, "DOE Solid-State Lighting CALiPER Program, Summary of Results: Round 5 of Product Testing," May 2008.
Web page, Product overview sheets for "Lexel" available from http://web.archive.org/web/s0070106231922/http://tirsys.com/technology/index.htm as retrieved Jan. 6, 2007.
Light Emitting Diodes (LEDs) for General Illumination, OIDA, edited by Tsao, J.Y. Sandia National Laboratories, Oct. 2002 available at http://lighting.sandia.gov/lgithingdocs/OIDA SSL LED Roadmap Full.pdf as retrieved on Jun. 10, 2004.
Narukawa, Yukio, Narita, Junya; Sakamoto, Takahiko; Deguchi, Kouichiro; Yamada, Tako; and Mukei Takashi, "Ultra-High Efficiency White Light Emitting Diodes", Japanese Journal of Applied Physics, vol. 45, No. 41, 2006, pp. L1084-L1086.
Zukausakas, A., Shuir M.S., Gaska, R., Introduction to Solid-State Lighting:, John Wiley & Sons, 2002, (Section 6.1 pp. 118-122).
Duggal, A. "Organic Electroluminescence" edited by Zakya Kafafi, CRC Press, 2005, p. 437-466.
Schubert, E.F., "Light-Emitting Diodes" 2nd ed. Cambridge University Press, 2006, Chapter 21, pp. 346-366.
U.S. Appl. No. 11/613,692, filed Dec. 20, 2006.
U.S. Appl. No 11/624,811, filed Jan. 19, 2007.
U.S. Appl. No. 11/870,679, filed Oct. 11, 2007.
U.S. Appl. No. 12/035,604, filed Feb. 22, 2008.
U.S. Appl. No. 11/708,818, filed Feb. 21, 2007.
U.S. Appl. No. 11/476,520, filed Jun. 27, 2006.
U.S. Appl. No. 11/947,323, filed Nov. 29, 2007.
Zhu et al., "Optimizing the Performance of Remote Phosphor LED," First International Conference on White LEDs and Solid State Lighting.

* cited by examiner

LIGHTING DEVICE

CROSS-REFERENCE TO RELATED APPLICATIONS

This application is a continuation of U.S. patent application Ser. No. 11/614,180, filed Dec. 21, 2006, the entirety of which is incorporated herein by reference.

This application claims the benefit of U.S. Provisional Patent Application No. 60/753,138, filed Dec. 22, 2005, the entirety of which is incorporated herein by reference.

This application claims the benefit of U.S. Provisional Patent Application No. 60/831,775, filed Jul. 19, 2006, the entirety of which is incorporated herein by reference.

FIELD OF THE INVENTION

The present invention relates to a lighting device, in particular, a device which includes one or more solid state light emitters and one or more luminescent materials (e.g., one or more phosphors). In a particular aspect, the present invention relates to a lighting device which includes one or more light emitting diodes, and one or more luminescent materials.

BACKGROUND OF THE INVENTION

A large proportion (some estimates are as high as one third) of the electricity generated in the United States each year goes to lighting. Accordingly, there is an ongoing need to provide lighting which is more energy-efficient. It is well-known that incandescent light bulbs are very energy-inefficient light sources—about ninety percent of the electricity they consume is released as heat rather than light. Fluorescent light bulbs are more efficient than incandescent light bulbs (by a factor of about 4) but are still quite inefficient as compared to solid state light emitters, such as light emitting diodes.

In addition, as compared to the normal lifetimes of solid state light emitters, incandescent light bulbs have relatively short lifetimes, i.e., typically about 750-1000 hours. In comparison, the lifetime of light emitting diodes, for example, can generally be measured in decades. Fluorescent bulbs have longer lifetimes (e.g., 10,000-20,000 hours) than incandescent lights, but provide less favorable color reproduction. Color reproduction is typically measured using the Color Rendering Index (CRI) which is a relative measure of the shift in surface color of an object when lit by a particular lamp. Daylight has the highest CRI (of 100), with incandescent bulbs being relatively close (about 95), and fluorescent lighting being less accurate (70-85). Certain types of specialized lighting have relatively low CRI's (e.g., mercury vapor or sodium, both as low as about 40 or even lower).

Another issue faced by conventional light fixtures is the need to periodically replace the lighting devices (e.g., light bulbs, etc.). Such issues are particularly pronounced where access is difficult (e.g., vaulted ceilings, bridges, high buildings, traffic tunnels) and/or where change-out costs are extremely high. The typical lifetime of conventional fixtures is about 20 years, corresponding to a light-producing device usage of at least about 44,000 hours (based on usage of 6 hours per day for 20 years). Light-producing device lifetime is typically much shorter, thus creating the need for periodic change-outs.

Accordingly, for these and other reasons, efforts have been ongoing to develop ways by which solid state light emitters can be used in place of incandescent lights, fluorescent lights and other light-generating devices in a wide variety of applications. In addition, where light emitting diodes (or other solid state light emitters) are already being used, efforts are ongoing to provide light emitting diodes (or other solid state light emitters) which are improved, e.g., with respect to energy efficiency, color rendering index (CRI), contrast, efficacy (lm/W), and/or duration of service.

A variety of solid state light emitters are well-known. For example, one type of solid state light emitter is a light emitting diode. Light emitting diodes are well-known semiconductor devices that convert electrical current into light. A wide variety of light emitting diodes are used in increasingly diverse fields for an ever-expanding range of purposes.

More specifically, light emitting diodes are semiconducting devices that emit light (ultraviolet, visible, or infrared) when a potential difference is applied across a p-n junction structure. There are a number of well-known ways to make light emitting diodes and many associated structures, and the present invention can employ any such devices. By way of example, Chapters 12-14 of Sze, Physics of Semiconductor Devices, (2d Ed. 1981) and Chapter 7 of Sze, Modern Semiconductor Device Physics (1998) describe a variety of photonic devices, including light emitting diodes.

The expression "light emitting diode" is used herein to refer to the basic semiconductor diode structure (i.e., the chip). The commonly recognized and commercially available "LED" that is sold (for example) in electronics stores typically represents a "packaged" device made up of a number of parts. These packaged devices typically include a semiconductor based light emitting diode such as (but not limited to) those described in U.S. Pat. Nos. 4,918,487; 5,631,190; and 5,912,477; various wire connections, and a package that encapsulates the light emitting diode.

As is well-known, a light emitting diode produces light by exciting electrons across the band gap between a conduction band and a valence band of a semiconductor active (light-emitting) layer. The electron transition generates light at a wavelength that depends on the band gap. Thus, the color of the light (wavelength) emitted by a light emitting diode depends on the semiconductor materials of the active layers of the light emitting diode.

Although the development of light emitting diodes has in many ways revolutionized the lighting industry, some of the characteristics of light emitting diodes have presented challenges, some of which have not yet been fully met. For example, the emission spectrum of any particular light emitting diode is typically concentrated around a single wavelength (as dictated by the light emitting diode's composition and structure), which is desirable for some applications, but not desirable for others, (e.g., for providing lighting, such an emission spectrum provides a very low CRI).

Because light that is perceived as white is necessarily a blend of light of two or more colors (or wavelengths), no single light emitting diode can produce white light. "White" light emitting diodes have been produced which have a light emitting diode pixel formed of respective red, green and blue light emitting diodes. Other "white" light emitting diodes have been produced which include (1) a light emitting diode which generates blue light and (2) a luminescent material (e.g., a phosphor) that emits yellow light in response to excitation by light emitted by the light emitting diode, whereby the blue light and the yellow light, when mixed, produce light that is perceived as white light.

In addition, the blending of primary colors to produce combinations of non-primary colors is generally well understood in this and other arts. In general, the 1931 CIE Chromaticity Diagram (an international standard for primary colors established in 1931), and the 1976 CIE Chromaticity Diagram (similar to the 1931 Diagram but modified such that similar distances on the Diagram represent similar differences in color) provide useful reference for defining colors as weighted sums of primary colors.

Light emitting diodes can thus be used individually or in any combinations, optionally together with one or more luminescent material (e.g., phosphors or scintillators) and/or filters, to generate light of any desired perceived color (including white). Accordingly, the areas in which efforts are being made to replace existing light sources with light emitting diode light sources, e.g., to improve energy efficiency, color rendering index (CRI), efficacy (lm/W), and/or duration of service, are not limited to any particular color or color blends of light.

A wide variety of luminescent materials (also known as lumiphors or luminophoric media, e.g., as disclosed in U.S. Pat. No. 6,600,175, the entirety of which is hereby incorporated by reference) are well-known and available to persons of skill in the art. For example, a phosphor is a luminescent material that emits a responsive radiation (e.g., visible light) when excited by a source of exciting radiation. In many instances, the responsive radiation has a wavelength which is different from the wavelength of the exciting radiation. Other examples of luminescent materials include scintillators, day glow tapes and inks which glow in the visible spectrum upon illumination with ultraviolet light.

Luminescent materials can be categorized as being down-converting, i.e., a material which converts photons to a lower energy level (longer wavelength) or up-converting, i.e., a material which converts photons to a higher energy level (shorter wavelength).

Inclusion of luminescent materials in LED devices has been accomplished by adding the luminescent materials to a clear encapsulant material (e.g., epoxy-based or silicone-based material) as discussed above, for example by a blending or coating process.

For example, U.S. Pat. No. 6,963,166 (Yano '166) discloses that a conventional light emitting diode lamp includes a light emitting diode chip, a bullet-shaped transparent housing to cover the light emitting diode chip, leads to supply current to the light emitting diode chip, and a cup reflector for reflecting the emission of the light emitting diode chip in a uniform direction, in which the light emitting diode chip is encapsulated with a first resin portion, which is further encapsulated with a second resin portion. According to Yano '166, the first resin portion is obtained by filling the cup reflector with a resin material and curing it after the light emitting diode chip has been mounted onto the bottom of the cup reflector and then has had its cathode and anode electrodes electrically connected to the leads by way of wires. According to Yano '166, a phosphor is dispersed in the first resin portion so as to be excited with the light A that has been emitted from the light emitting diode chip, the excited phosphor produces fluorescence ("light B") that has a longer wavelength than the light A, a portion of the light A is transmitted through the first resin portion including the phosphor, and as a result, light C, as a mixture of the light A and light B, is used as illumination.

As noted above, "white LED lights" (i.e., lights which are perceived as being white or near-white) have been investigated as potential replacements for white incandescent lamps. A representative example of a white LED lamp includes a package of a blue light emitting diode chip, made of gallium nitride (GaN), coated with a phosphor such as YAG. In such an LED lamp, the blue light emitting diode chip produces an emission with a wavelength of about 450 nm, and the phosphor produces yellow fluorescence with a peak wavelength of about 550 nm on receiving that emission. For instance, in some designs, white light emitting diodes are fabricated by forming a ceramic phosphor layer on the output surface of a blue light-emitting semiconductor light emitting diode. Part of the blue ray emitted from the light emitting diode chip passes through the phosphor, while part of the blue ray emitted from the light emitting diode chip is absorbed by the phosphor, which becomes excited and emits a yellow ray. The part of the blue light emitted by the light emitting diode which is transmitted through the phosphor is mixed with the yellow light emitted by the phosphor. The viewer perceives the mixture of blue and yellow light as white light.

As also noted above, in another type of LED lamp, a light emitting diode chip that emits an ultraviolet ray is combined with phosphor materials that produce red (R), green (G) and blue (B) light rays. In such an LED lamp, the ultraviolet ray that has been radiated from the light emitting diode chip excites the phosphor, causing the phosphor to emit red, green and blue light rays which, when mixed, are perceived by the human eye as white light. Consequently, white light can also be obtained as a mixture of these light rays.

Designs have been provided in which existing LED component packages and other electronics are assembled into a fixture. In such designs, a packaged LED is mounted to a circuit board, the circuit board is mounted to a heat sink, and the heat sink is mounted to the fixture housing along with required drive electronics. In many cases, additional optics (secondary to the package parts) are also necessary.

In substituting light emitting diodes for other light sources, e.g., incandescent light bulbs, packaged LEDs have been used with conventional light fixtures, for example, fixtures which include a hollow lens and a base plate attached to the lens, the base plate having a conventional socket housing with one or more contacts which are electrically coupled to a power source. For example, LED light bulbs have been constructed which comprise an electrical circuit board, a plurality of packaged LEDs mounted to the circuit board, and a connection post attached to the circuit board and adapted to be connected to the socket housing of the light fixture, whereby the plurality of LEDs can be illuminated by the power source.

There is an ongoing need for ways to use solid state light emitters, e.g., light emitting diodes, in a wider variety of applications, with greater energy efficiency, with improved color rendering index (CRI), with improved efficacy (lm/W), and/or with longer duration of service, for all possible light colors, including white light (including light perceived as white light).

BRIEF SUMMARY OF THE INVENTION

As indicated above, in conventional LED packages which employ a luminescent material in order to provide light of one or more particular color hues, the LEDs are typically covered with an encapsulant, e.g., a cured polymeric resin, in which a luminescent material, e.g., a phosphor, has been dispersed.

In addition, as described in U.S. Patent Application No. 60/752,753, filed on Dec. 21, 2005, entitled "Lighting Device" (inventors: Gerald H. Negley, Antony Paul Ven de Ven and Neal Hunter), the entirety of which is hereby incorporated by reference, lighting devices have been developed which employ solid state light emitters (e.g., light emitting diode chips) and luminescent material, in which the solid state light emitters (e.g., chips) are mounted on housings.

The general object of the present invention is to maximize the light extraction from the solid state light emitter (e.g., light emitting diode chip) or the package (e.g., LED package) in such devices.

In the case of conventional LED packages which include a phosphor, a significant proportion (e.g., in many cases, as much as 20% to 25%) of the excitation light (i.e., light from the LED) is reflected (back scattered) from the phosphor back into the light emitting diode chip/package. Back scattered light which is scattered back into the light emitting diode chip itself has a very low probability of coming out of the chip, and hence, such back scattering results in a system loss of energy.

In addition, the phosphor converted light is omni-directional, so that in general, 50% of the light is directed back to the LED source.

Furthermore, if the luminescent element is too thick, and/or if the luminescent material (e.g., phosphor) content in the luminescent element is too great, "self-absorption" may occur. Self-absorption occurs when light emissions within the packaging layer stay within the packaging layer to excite other phosphor particles and eventually are absorbed or are otherwise prevented from exiting the device, thus reducing performance (intensity) and efficiency. Additionally, if the particle size of the luminescent material (e.g., phosphors) is too large, the particles of luminescent material can cause unwanted scattering of both the excitation source (the LED chip) and the light generated by the phosphor.

In accordance with one aspect of the present invention, by spatially separating the solid state light emitter from the luminescent element, this extraction efficiency can be improved. In addition, by making the surface area of the illumination surface of the solid state light emitter which faces the luminescent element much smaller than the surface area of the luminescent element which faces the solid state light emitter, any backscatter light from the excitation source or any emitted light from the luminescent element has a lower probability of reabsorption in the solid state light emitter.

In accordance with a first aspect of the present invention, there is provided a lighting device comprising at least one solid state light emitter and at least one luminescent element, in which the luminescent element comprises at least one luminescent material and is spaced from the solid state light emitter. In this aspect of the invention, a luminescent element surface of the luminescent element has a surface area which is at least twice as large (in some embodiments at least five times as large, and in some embodiments at least ten times as large) as an illumination surface of the solid state light emitter.

In a specific feature according to this aspect, the luminescent element is spaced from the solid state light emitter by a distance which is at least equal to a largest dimension of the illumination surface.

In a specific feature according to this aspect, the luminescent element is spaced from the solid state light emitter by a distance in the range of from about 100 micrometers to about 750 micrometers (for example, from about 500 micrometers to about 750 micrometers, e.g., about 750 micrometers).

In accordance with a second aspect of the present invention, there is provided a lighting device comprising at least one solid state light emitter and at least one luminescent element, in which the luminescent element comprises at least one luminescent material and is spaced from the solid state light emitter. In this aspect of the invention, the solid state light emitter has an illumination surface facing the luminescent element and the luminescent element has a luminescent element surface facing the solid state light emitter. In addition, in this aspect of the invention, the luminescent element surface is substantially parallel to the illumination surface, and the luminescent element surface has a surface area which is at least twice as large (in some embodiments at least five times as large, and in some embodiments at least ten times as large) as the surface area of the illumination surface.

In a specific feature according to this aspect, the luminescent element is spaced from the solid state light emitter by a distance which is at least equal to a largest dimension of the illumination surface.

In accordance with a third aspect of the present invention, there is provided a lighting device comprising at least one solid state light emitter and at least one luminescent element, in which the luminescent element comprises at least one luminescent material and the luminescent element is spaced from the solid state light emitter.

In this aspect, an imaginary first flat shape is defined by a set of luminescent element points, each of the luminescent element points being located in an x-y plane oriented relative to a z axis which passes through a center of the solid state light emitter and a center of the luminescent element and having x, y coordinates which correspond, for each radial position relative to the z axis, to x, y coordinates of a point on the luminescent element which is the farthest from the z axis at such radial location, i.e., the first flat shape is a projection of the luminescent element onto a plane which is perpendicular to the z axis connecting the respective centers of the luminescent element and the solid state light emitter. An imaginary second flat shape is defined by a set of light emitter points, each of the light emitter points being located in an x-y plane oriented relative to the z axis and having x, y coordinates which correspond, for each radial position relative to the z axis, to x, y coordinates of a point on the solid state light emitter which is the farthest from the z axis at such radial location i.e., the second flat shape is a projection of the solid state light emitter onto a plane which is perpendicular to the z axis. In this aspect, the area of the first flat shape is at least twice as large (in some embodiments at least five times as large, and in some embodiments at least ten times as large) as the area of the second flat shape (where more than one solid state light emitter is present in the lighting device, the solid state light emitter in the above comparison being the one that has the largest second flat shape of any solid state light emitter in the lighting device).

In a specific feature according to this aspect, the luminescent element is spaced from the solid state light emitter by a distance which is at least equal to a largest dimension of the second flat shape.

In a further specific feature according to the present invention, the solid state light emitter is a light emitting diode chip.

In a further specific feature according to the present invention, the solid state light emitter has an illumination surface which is substantially planar.

In a further specific feature according to the present invention, the luminescent element has a luminescent surface which is substantially planar.

In a further specific feature according to the present invention, the luminescent element comprises a matrix (e.g., which may be a polymeric material, which may have been cured) in which a luminescent material is contained.

In a further specific feature according to the present invention, a luminescent material is contained in the luminescent element in an amount which is not greater than about 15% by volume.

In a further specific feature according to the present invention, the luminescent element comprises at least one phosphor.

In a further specific feature according to the present invention, the luminescent element comprises particles of luminescent material which have an average particle size of not greater than 50 microns.

In a further specific feature according to the present invention, a thickness of the luminescent element is not greater than 1 cm.

In a specific aspect, the lighting device is one that can produce light that is perceived as "white".

The invention may be more fully understood with reference to the accompanying drawings and the following detailed description of the invention.

DETAILED DESCRIPTION OF THE INVENTION

As noted above, in accordance with various aspects of the present invention, there is provided a lighting device comprising at least one solid state light emitter and at least one luminescent element, the luminescent element comprising at least one luminescent material.

Any desired solid state light emitter or emitters can be employed in accordance with the present invention. Persons of skill in the art are aware of, and have ready access to, a wide variety of such emitters. Such solid state light emitters include inorganic and organic light emitters. Examples of types of such light emitters include light emitting diodes (inorganic or organic), laser diodes and thin film electroluminescent devices, a variety of each of which are well-known in the art. As noted above, a wide variety of luminescent materials (also known as lumiphors or luminophoric media, e.g., as disclosed in U.S. Pat. No. 6,600,175, the entirety of which is hereby incorporated by reference) are well-known and available to persons of skill in the art, and any such materials can be used in accordance with the present invention.

In one aspect of the present invention, there is provided a device which comprises at least first and second solid state light emitters, in which the first solid state light emitter emits light of a first wavelength and the second solid state light emitter emits light of a second wavelength, the second wavelength differing from the first wavelength. In such a device, the solid state light emitters can emit light of any desired wavelength or wavelengths (or wavelength range or wavelength ranges) within the ranges of infrared, visible and ultraviolet light, including, e.g., (1) two or more light emitting diodes emitting light within different wavelength ranges within the visible spectrum, (2) two or more light emitting diodes emitting light within different wavelength ranges within the infrared spectrum, (3) two or more light emitting diodes emitting light within different wavelength ranges within the ultraviolet spectrum, (4) one or more light emitting diodes emitting light within the visible spectrum and one or more light emitting diodes emitting light within the infrared spectrum, (5) one or more light emitting diodes emitting light within the visible spectrum and one or more light emitting diodes emitting light within the ultraviolet spectrum, etc.

As noted above, persons skilled in the art are familiar with a wide variety of light emitters, including a wide variety of light emitting diodes, a wide variety of laser diodes and a wide variety of thin film electroluminescent devices, and therefore it is not necessary to describe in detail such devices, and/or the materials out of which such devices are made.

As indicated above, the lighting devices according to the present invention can comprise any desired number of solid state emitters. For example, a lighting device according to the present invention can include 50 or more light emitting diodes, or can include 100 or more light emitting diodes, etc. In general, with current light emitting diodes, greater efficiency can be achieved by using a greater number of smaller light emitting diodes (e.g., 100 light emitting diodes each having a surface area of 0.1 mm$^2$ vs. 25 light emitting diodes each having a surface area of 0.4 mm$^2$ but otherwise being identical).

Analogously, light emitting diodes which operate at lower current densities are generally more efficient. Light emitting diodes which draw any particular current can be used according to the present invention. In one aspect of the present invention, light emitting diodes which each draw not more than 50 milliamps are employed.

The solid state light emitters and luminescent elements in the lighting devices of the present invention can be arranged, mounted and supplied with electricity in any desired manner, and can be mounted on any desired housing or fixture, and the solid state light emitters can be supplied with electricity in any desired manner. Skilled artisans are familiar with a wide variety of arrangements, mounting schemes, power supplying apparatuses, housings and fixtures, and any such arrangements, schemes, apparatuses, housings and fixtures can be employed in connection with the present invention. The lighting devices of the present invention can be electrically connected (or selectively electrically connected) to any desired power source, persons of skill in the art being familiar with a variety of such power sources.

Representative examples of arrangements of solid state light emitters and luminescent elements, schemes for mounting solid state light emitters and luminescent elements, apparatus for supplying electricity to solid state light emitters, housings for solid state light emitters and luminescent elements, fixtures for solid state light emitters and luminescent elements and power supplies for solid state light emitters, all of which are suitable for the lighting devices of the present invention, are described in U.S. Patent Application No. 60/752,753, filed concurrently herewith, entitled "Lighting Device" (inventors: Gerald H. Negley, Antony Paul Ven de Ven and Neal Hunter), the entirety of which is hereby incorporated by reference. Such fixtures also make it possible to integrate excellent thermal dissipation into the light fixture itself.

In some embodiments of the lighting devices according to the present invention, the lighting device comprises a housing which has a highly reflective element having tapered walls, e.g., the device comprises reflective walls which define a truncated cone (frustoconical shape). It has been observed, in accordance with the present invention, that the overall extraction efficiency (through the optic) can be improved by including such a reflective element having tapered walls.

In some embodiments of the lighting devices according to the present invention, the lighting device comprises a housing which has a highly reflective element having substantially straight walls, e.g., the device comprises reflective walls which define a cylinder.

The expression "on", e.g., as used above in the expression "mounted on", means that the first structure which is "on" a second structure can be in contact with the second structure, or can be separated from the second structure by one or more intervening structures.

A statement herein that items are "electrically connected," means that there are no components electrically between the items, the insertion of which materially affect the function or functions provided by the device. For example, two items can be referred to as being electrically connected, even though they may have a small resistor between them which does not materially affect the function or functions provided by the device (indeed, a wire connecting two items can be thought of as a small resistor); likewise, two items can be referred to as being electrically connected, even though they may have an additional electrical item between them which allows the device to perform an additional function, while not materially affecting the function or functions provided by a device which is identical except for not including the additional item; similarly, two items which are directly connected to each other, or which are directly connected to opposite ends of a wire or a trace on a circuit board or another medium, are electrically connected.

The one or more luminescent materials can be any desired luminescent material. As noted above, persons skilled in the art are familiar with, and have ready access to, a wide variety of luminescent materials. The one or more luminescent materials can be down-converting or up-converting, or can include a combination of both types.

For example, the one or more luminescent materials can be selected from among phospors, scintillators, day glow tapes, inks which glow in the visible spectrum upon illumination with ultraviolet light, etc.

The one or more luminescent materials, when included, can be provided in any desired form. For example, in one aspect, a lighting device according to the present invention can comprise at least one luminescent element which comprises the first luminescent material, the luminescent element being attached to a housing, the luminescent element and the housing defining an internal space, at least one of the solid state light emitters being positioned within the internal space.

The luminescent element can, if desired, comprise a material in which the first luminescent material is embedded. For example, persons of skill in the art are very familiar with luminescent elements comprising a luminescent material, e.g., a phosphor, embedded in a resin (i.e., a polymeric matrix), such as a silicone material or an epoxy material.

In a preferred aspect of the present invention, the lighting device comprises at least one luminescent element which comprises at least a first luminescent element region and a second luminescent element region, the first luminescent element region comprising a first luminescent material, the second luminescent element region comprising a second luminescent material, the first luminescent material, upon being excited, emitting light of a first wavelength (or range of wavelengths), the second luminescent material, upon being excited, emitting light of a second wavelength (or range of wavelengths), the second wavelength (or range of wavelengths) differing from the first wavelength (or range of wavelengths).

In accordance with another preferred aspect of the invention, a lighting device can comprise a plurality of luminescent elements, each luminescent element comprising at least one luminescent material, each luminescent element being attached to a housing to define an internal space, at least one solid state light emitter being positioned within each internal space.

In embodiments of the present invention in which a plurality of solid state light emitters are mounted on a housing, the heat load produced by the solid state light emitters is distributed over the surface of the housing. The more uniformly the solid state light emitters are distributed over the surface area of the housing, the more uniformly the heat load is distributed. As a result, the housing can provide more efficient heat dissipation, with the result that the housing can, if desired, be made smaller than would otherwise be the case.

In addition, by having multiple solid state light emitters (as opposed to a single point source of light), the light source is affected less by shadowing—that is, if an object which is smaller than the light emitting area is placed in front of the light emitting area, only a portion of the light rays would be blocked. Since the light sources follow the Huygens principle (each source acts as a spherical wave front), the viewing of a shadow is not seen, and only a slight dimming of the illuminated source is seen (in contrast to where a single filament is employed, where the light would be substantially dimmed and a shadow would be observed).

The devices according to the present invention can further comprise one or more long-life cooling device (e.g., a fan with an extremely high lifetime). Such long-life cooling device(s) can comprise piezoelectric or magnetorestrictive materials (e.g., MR, GMR, and/or HMR materials) that move air as a "Chinese fan". In cooling the devices according to the present invention, typically only enough air to break the boundary layer is required to induce temperature drops of 10 to 15 degrees C. Hence, in such cases, strong "breezes" or a large fluid flow rate (large CFM) are typically not required (thereby avoiding the need for conventional fans).

The devices according to the present invention can further comprise secondary optics to further change the projected nature of the emitted light. Such secondary optics are well-known to those skilled in the art, and so they do not need to be described in detail herein—any such secondary optics can, if desired, be employed.

The devices according to the present invention can further comprise sensors or charging devices or cameras, etc. For example, persons of skill in the art are familiar with, and have ready access to, devices which detect one or more occurrence (e.g., motion detectors, which detect motion of an object or person), and which, in response to such detection, trigger illumination of a light, activation of a security camera, etc. As a representative example, a device according to the present invention can include a lighting device according to the present invention and a motion sensor, and can be constructed such that (1) while the light is illuminated, if the motion sensor detects movement, a security camera is activated to record visual data at or around the location of the detected motion, or (2) if the motion sensor detects movement, the light is illuminated to light the region near the location of the detected motion and the security camera is activated to record visual data at or around the location of the detected motion, etc.

Figure 1:
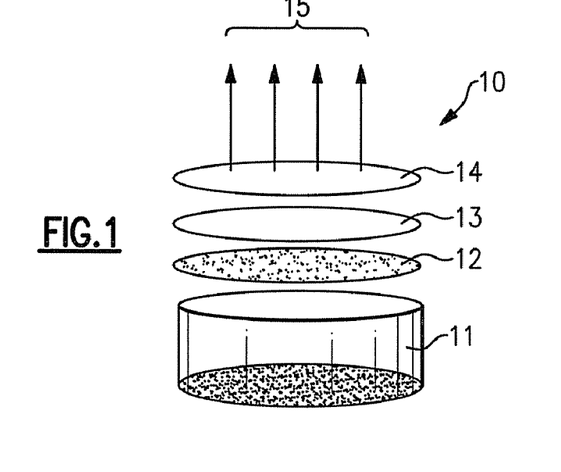
FIG. 1 is a schematic illustration depicting an embodiment of a lighting device 10 in accordance with the present invention.

FIG. 1 is a schematic illustration depicting an embodiment of a lighting device 10 in accordance with the present invention.

The lighting device depicted in FIG. 1 includes a fixture 11 (shown schematically) based with a blue light source (one or more light emitting diodes) and highly reflective surfaces, a phosphor and scattering layer 12 having a surface area which is larger than the light emitting diode(s) (the phosphor generating yellow light, upon excitation from light from the light emitting diode), and a pair of brightness enhancement films 13 and 14, with uniform white light 15 exiting the lighting device 10.

Brightness enhancement films are well-known in the art and are readily available. Brightness enhancement films (e.g., BEF films commercially available from 3M) are optional—when employed, they provide a more directional light source by limiting the acceptance angle. Light not "accepted" is recycled by the highly reflective light source enclosure.

The scattering layer is also optional. The scattering layer can be included in the phosphor layer, and/or a separate scattering layer can be provided. A wide variety of separate scattering layers and combined luminescent and scattering layers are well known to those of skill in the art, and any such layers can be employed in the lighting devices of the present invention.

In some embodiments in which there is included a brightness enhancement film (which can optionally be replaced by one or more extraction films, such as by WFT), the brightness enhancement film is optimized to limit the viewing angle of the emitted source and to increase the probability of extracting light on the first (or earliest possible) pass.

In some embodiments of the lighting devices according to the present invention, the lighting device comprises a diffuser which provides photo recycling within a particular extraction angle, with losses which are less than those typically associated with BEF films. Some such diffusers diffuse and scatter light. An example of such a phot recycling diffuser is the "Engineered Diffuser"™ available from RPC Photonics.

Preferably, one or more surfaces of the fixture (e.g., the housing) are reflective, so that light from some or all of the solid state light emitters, e.g., light emitting diodes, is reflected by such reflective surfaces.

Figure 2:
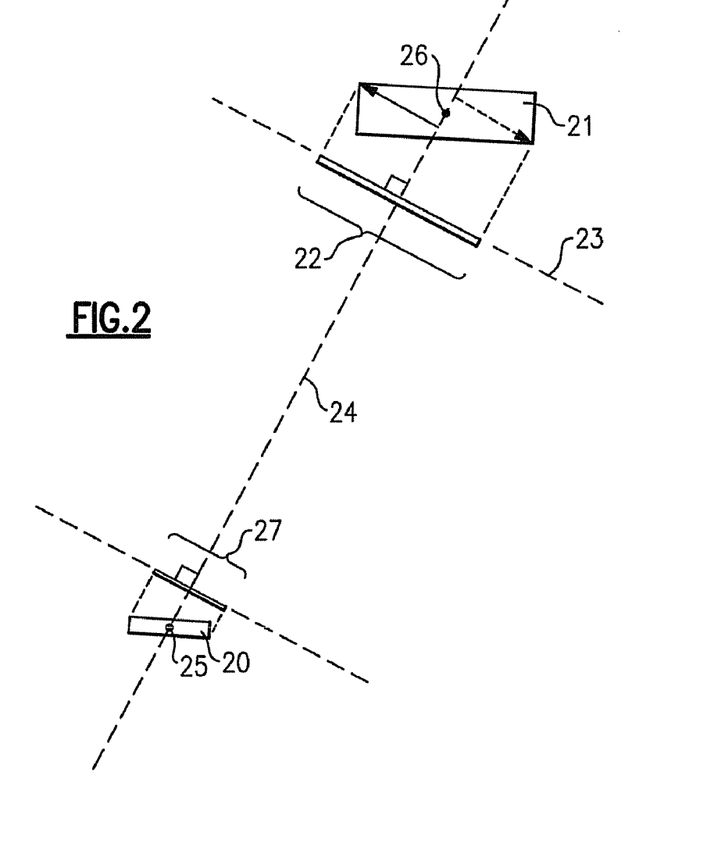
FIG. 2 depicts a light emitting diode and a luminescent element in order to further explain the terminology set forth above regarding the third aspect of the present invention.

FIG. 2 depicts a light emitting diode 20 and a luminescent element 21 which are oriented relative to one another in a way such that they do not have respective surfaces facing one another, in order to further explain the terminology set forth above regarding the third aspect of the present invention.

As noted above, in the third aspect of the present invention, a first (imaginary) flat shape 22 is defined by a set of luminescent element points, each of the luminescent element points being located in an x-y plane 23 oriented relative to a z axis 24 which passes through a center 25 of the light emitting diode and a center 26 of the luminescent element and having x, y coordinates which correspond, for each radial position relative to the z axis, to x, y coordinates of a point on the luminescent element which is the farthest from the z axis at such radial location, i.e., the first flat shape is a projection of the luminescent element onto a plane which is perpendicular to the z axis connecting the respective centers of the luminescent element and the solid state light emitter. A second (imaginary) flat shape 27 is defined by a set of light emitter points, each of the light emitter points being located in an x-y plane oriented relative to the z axis and having x, y coordinates which correspond, for each radial position relative to the z axis, to x, y coordinates of a point on the solid state light emitter which is the farthest from the z axis at such radial location i.e., the second flat shape is a projection of the solid state light emitter onto a plane which is perpendicular to the z axis. In the third aspect of the present invention, the area of the first flat shape 22 is at least twice as large as the area of the second flat shape 27.

Figure 3:
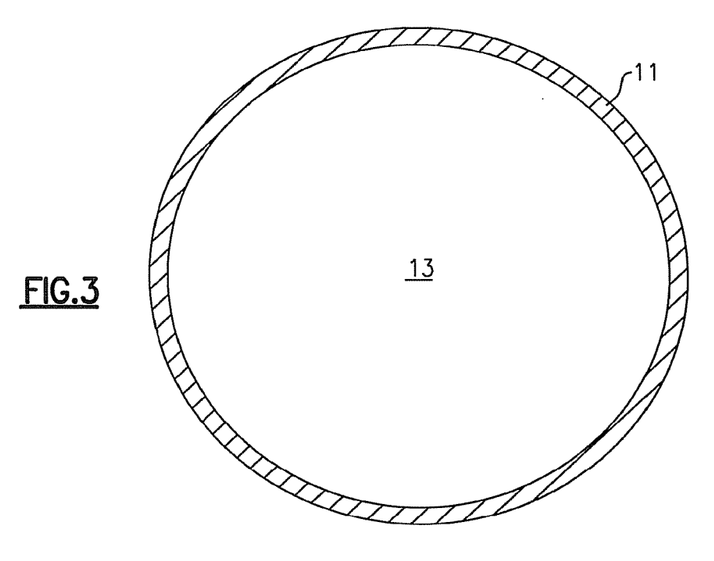
FIG. 3 is a sectional view of a representative example of a reflective housing for use in lighting devices according to the present inventive subject matter.

FIG. 3 is a sectional view of a representative example of a reflective hollow conical housing for use in lighting devices according to the present inventive subject matter.

Figure 4:
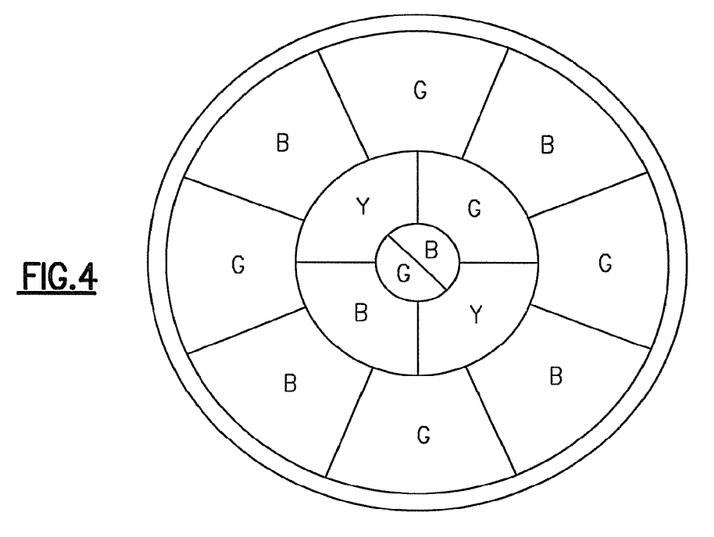
FIG. 4 depicts a luminescent element that has a plurality of regions.

FIG. 4 depicts a luminescent element 33 that has a plurality of regions, each of the regions having a luminescent material selected from among luminescent material which, when illuminated, emit blue light, green light or yellow light. The regions depicted in FIG. 4 are marked to indicate the type of luminescent material in each region, where a "B" marked in the region indicates that the region contains luminescent material which, when illuminated, will emit blue light, where a "G" marked in the region indicates that the region contains luminescent material which, when illuminated, will emit green light, and where a "Y" marked in the region indicates that the region contains luminescent material which, when illuminated, will emit yellow light.

Figure 5:
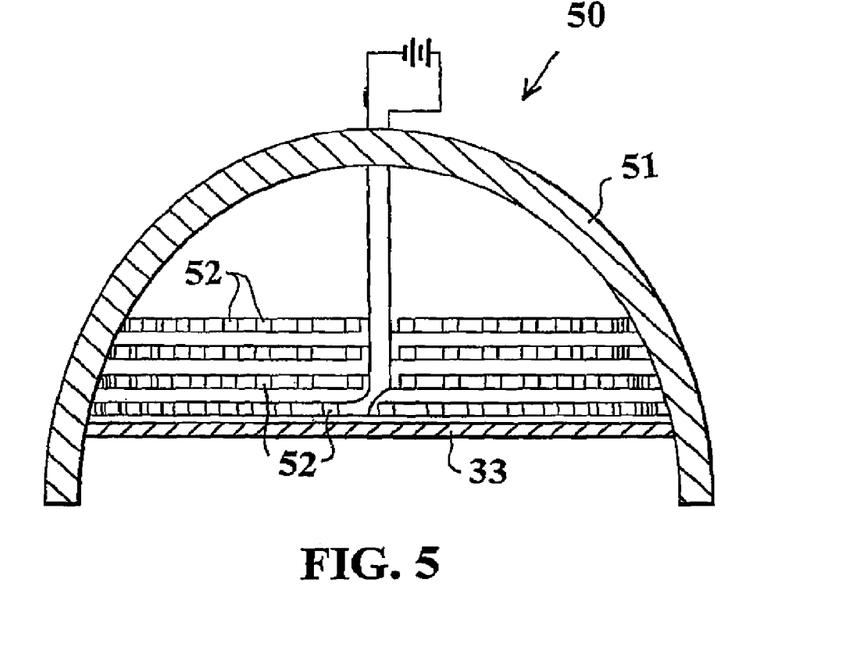
FIG. 5 is a sectional view of a lighting device according to the present inventive subject matter, which includes a luminescent element 33 as depicted in FIG. 4.

FIG. 5 is a sectional view of a lighting device 50 according to the present inventive subject matter. Referring to FIG. 5, the lighting device 50 comprises a housing 51, a plurality of light emitting diodes 52 mounted on the housing 51, and the substantially circular luminescent element 33 attached to the housing 51. The housing 51 and the luminescent element 33 together define an internal space within which each of the light emitting diodes 52 is positioned.

Any two or more structural parts of the lighting devices described herein can be integrated. Any structural part of the lighting devices described herein can be provided in two or more parts (which can be held together, if necessary).

The invention claimed is:

1. A lighting device comprising:
   at least a first solid state light emitter;
   a housing; and
   at least one luminescent element,
   the luminescent element spaced from the first solid state light emitter,
   the luminescent element comprising at least a first luminescent element region and a second luminescent element region, the first luminescent element region comprising a first luminescent material, the second luminescent element region comprising a second luminescent material, the first luminescent material, upon being excited, emitting light of a first wavelength or range of wavelengths, the second luminescent material, upon being excited, emitting light of a second wavelength or range of wavelengths, the second wavelength or range of wavelengths differing from the first wavelength or range of wavelengths,
   the luminescent element and the housing surrounding an internal space, and
   at least the first solid state light emitter in the internal space.

2. A lighting device as recited in claim 1, wherein the first solid state light emitter is a light emitting diode chip.

3. A lighting device as recited in claim 1, wherein the luminescent element comprises a matrix in which a luminescent material is contained.

4. A lighting device as recited in claim 1, wherein the lighting device further comprises at least one scattering layer.

5. A lighting device as recited in claim 1, wherein the lighting device further comprises at least one brightness enhancing film.

6. A lighting device as recited in claim 1, wherein the luminescent element is also a scattering layer.

7. A lighting device as recited in claim 1, wherein:
   the lighting device comprises at least the first and a second solid state light emitter,
   the first solid state light emitter emits light of a first wavelength,
   the second solid state light emitter emits light of a second wavelength, and
   the first wavelength differs from the second wavelength.

8. A lighting device as recited in claim 1, wherein:
   the lighting device further comprises a housing,
   the housing comprises at least one reflective element,
   at least a portion of the reflective element is substantially cylindrical or substantially frustoconical.

9. A lighting device as recited in claim 1, wherein the luminescent element is attached to the housing.

10. A lighting device comprising:
at least a first solid state light emitter and a second solid state light emitter; and
at least one luminescent element,
the luminescent element spaced from the first solid state light emitter,
the luminescent element comprising at least a first luminescent element region and a second luminescent element region, the first luminescent element region comprising a first luminescent material, the second luminescent element region comprising a second luminescent material, the first luminescent material, upon being excited, emitting light of a first wavelength or range of wavelengths, the second luminescent material, upon being excited, emitting light of a second wavelength or range of wavelengths, the second wavelength or range of wavelengths differing from the first wavelength or range of wavelengths,
the first solid state light emitter emits light of a first wavelength,
the second solid state light emitter emits light of a second wavelength,
the first wavelength differs from the second wavelength.

11. A lighting device as recited in claim 10, wherein the first solid state light emitter is a light emitting diode chip.

12. A lighting device as recited in claim 10, wherein the luminescent element comprises a matrix in which a luminescent material is contained.

13. A lighting device as recited in claim 10, wherein the lighting device further comprises at least one scattering layer.

14. A lighting device as recited in claim 10, wherein the lighting device further comprises at least one brightness enhancing film.

15. A lighting device as recited in claim 10, wherein the luminescent element is also a scattering layer.

16. A lighting device as recited in claim 10, wherein:
the luminescent element is attached to a housing,
the luminescent element and the housing define an internal space, and
at least the first solid state light emitter is positioned within the internal space.

17. A lighting device as recited in claim 10, wherein:
the lighting device further comprises a housing,
the housing comprises at least one reflective element,
at least a portion of the reflective element is substantially cylindrical or substantially frustoconical.

18. A lighting device comprising:
at least a first solid state light emitter;
at least one luminescent element, the luminescent element comprising at least one luminescent material, the luminescent element spaced from the first solid state light emitter; and
at least one secondary optics element,
the luminescent element comprising at least a first luminescent element region and a second luminescent element region,
the first luminescent element region comprising a first luminescent material,
the second luminescent element region comprising a second luminescent material,
the first luminescent material, upon being excited, emits light of a first wavelength or range of wavelengths,
the second luminescent material, upon being excited, emits light of a second wavelength or range of wavelengths, and
the second wavelength or range of wavelengths differing from the first wavelength or range of wavelengths.

19. A lighting device as recited in claim 18, wherein:
the lighting device comprises at least the first and a second solid state light emitter,
the first solid state light emitter emits light of a first wavelength,
the second solid state light emitter emits light of a second wavelength, and
the first wavelength differs from the second wavelength.

20. A lighting device as recited in claim 18, wherein:
the luminescent element is attached to a housing,
the luminescent element and the housing define an internal space, and
at least the first solid state light emitter is positioned within the internal space.

21. A lighting device as recited in claim 18, wherein:
the lighting device further comprises a housing,
the housing comprises at least one reflective element,
at least a portion of the reflective element is substantially cylindrical or substantially frustoconical.

* * * * *